United States Patent
Sato et al.

(10) Patent No.: US 8,425,790 B2
(45) Date of Patent: Apr. 23, 2013

(54) INK-JET INK COMPOSITION FOR ETCHING RESIST

(75) Inventors: Masaki Sato, Chiba (JP); Seiju Suzuki, Chiba (JP); Shuichi Sugita, Chiba (JP); Kenichi Kaneda, Saitama (JP); Shigenori Kobayashi, Saitama (JP)

(73) Assignees: Nisshin Steel Co., Ltd., Tokyo (JP); Tokyo Printing Ink Mfg. Co., Ltd., Tokyo (JP)

( * ) Notice: Subject to any disclaimer, the term of this patent is extended or adjusted under 35 U.S.C. 154(b) by 105 days.

(21) Appl. No.: 12/933,938

(22) PCT Filed: Jan. 27, 2009

(86) PCT No.: PCT/JP2009/000309
§ 371 (c)(1),
(2), (4) Date: Sep. 22, 2010

(87) PCT Pub. No.: WO2009/118976
PCT Pub. Date: Oct. 1, 2009

(65) Prior Publication Data
US 2011/0024392 A1    Feb. 3, 2011

(30) Foreign Application Priority Data

Mar. 27, 2008 (JP) .................. 2008-084470
Aug. 26, 2008 (JP) .................. 2008-216909

(51) Int. Cl.
*B44C 1/22* (2006.01)
*C08F 2/46* (2006.01)

(52) U.S. Cl.
USPC .................. 216/48; 430/24; 522/171

(58) Field of Classification Search ........ 216/48; 522/171
See application file for complete search history.

(56) References Cited

U.S. PATENT DOCUMENTS

| | | | |
|---|---|---|---|
| 2002/0146629 A1* | 10/2002 | Nikaidou et al. | 430/24 |
| 2004/0249012 A1 | 12/2004 | Tanaka et al. | |
| 2008/0227884 A1 | 9/2008 | Mineo et al. | |
| 2008/0233307 A1 | 9/2008 | Satou et al. | |

FOREIGN PATENT DOCUMENTS

| | | | |
|---|---|---|---|
| JP | 56-066089 A | 6/1981 | |
| JP | 56-157089 A | 12/1981 | |
| JP | 58-050794 A | 3/1983 | |
| JP | 59-041320 A | 3/1984 | |
| JP | 60-208313 A | 10/1985 | |
| JP | 61-076516 A | 4/1986 | |
| JP | 61-076562 A | 4/1986 | |
| JP | 61-111379 A | 5/1986 | |
| JP | 01-242609 A | 9/1989 | |
| JP | 05-100423 A | 4/1993 | |
| JP | 07-076663 A | 3/1995 | |
| JP | 2002-080511 A | 3/2002 | |
| JP | 2002-129079 A | 5/2002 | |
| JP | 2002-194013 A | 7/2002 | |
| JP | 2002-241647 A | 8/2002 | |
| JP | 2006-328227 A | 12/2006 | |
| JP | 2007-131755 A | 5/2007 | |
| JP | 2008-214607 A | 9/2008 | |
| JP | 2008-222677 A | 9/2008 | |
| WO | 2004/026977 A1 | 4/2004 | |
| WO | 2004/106437 A1 | 12/2004 | |
| WO | WO 2004106437 A1 * | 12/2004 | |

OTHER PUBLICATIONS

Office Action for German Patent Application 11 2009 000 690.6, German Patent Office, Jan. 17, 2012.
Office Action for Chinese Patent Application 200980109426.8, Patent Office for China Dec. 26, 2012.

* cited by examiner

*Primary Examiner* — Nadine G Norton
*Assistant Examiner* — Mahmoud Dahimene
(74) *Attorney, Agent, or Firm* — Kubotera & Associates, LLC

(57) ABSTRACT

An ink composition for ink jet printing is provided which gives a cured object excellent in adhesion to metallic plates, resistance to etchants, and alkali removability and can be stably ejected with an ink jet apparatus. The ink jet composition for etching resists has a viscosity at 25° C. of 3-50 mPa s and includes monomers comprising: either a polymerizable phosphoric ester compound represented by general formula (I); a polyfunctional monomer having two or more ethylenic double-bond groups per molecule and having no phosphoric ester group, the content of the ethylenic double-bond groups being $4 \times 10^{-3}$ to $8 \times 10^{-3}$ mol/g; and a monofunctional monomer having one ethylenic double-bond group per molecule and having neither phosphoric ester group nor carboxy group.

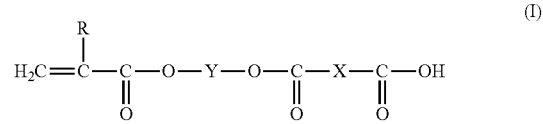

(I)

In the formula, X represents $C_{1-3}$ alkylene, Y represents $C_{2-3}$ alkylene, and R represents hydrogen or methyl.

5 Claims, No Drawings

INK-JET INK COMPOSITION FOR ETCHING RESIST

TECHNICAL FIELD

The present invention relates to inkjet ink compositions for etching resist, more particularly to inkjet ink compositions to be cured by active energy ray for etching resist.

BACKGROUND ART

For their good appearance, etched metal plates—metal plates whose surface is patterned by etching—have been used as elevator doors or in other applications where a quality appearance is required. Typically, an etched metal plate is manufactured by 1) applying a photosensitive resin onto either or both surfaces of a metal plate to form thereon a resin film; 2) exposing the resin film through a patterned photo mask (also referred to as a "resist pattern") to cure exposed portions of the photosensitive film; 3) developing away non-exposed portions of the photosensitive resin film; 4) etching the metal with an etchant such as iron(III) chloride solution; and 5) subjecting the cured resin film to alkali treatment.

In the above manufacturing method, the photosensitive resin (also referred to as "etching resist resin") needs to be in tight contact with the metal plate. For this, pre-treatment is carried out on the metal plate; for example, the metal plate is subjected to such degreasing treatment as alkali degreasing, solvent degreasing or electrolytic degreasing, followed by washing and drying. Moreover, in some cases, acid washing is further carried out after degreasing treatment. Nevertheless, due to the presence of thick oxide coating, metal plates often exhibit poor adhesion to etching resist resin irrespective of adequate degreasing treatment. Insufficient adhesion facilitates intrusion of etchant between the interface of the metal and etching resist resin, which tends to accelerate lateral etching and therefore increases side etching rate. This also facilitates partial separation of the etching resist film, resulting in etching of unwanted portions. Thus it becomes difficult to precisely form an etched metal plate of desired shape unless sufficient adhesion is ensured. Accordingly, etching resist resins need to have sufficient adhesion to metal plates.

Etching resist resins are also required to have sufficient resistance to etchant such as iron(III) chloride solution (etchant resistance), and cured films thereof are required to be readily dissolved and separated by alkali treatment (alkali developability).

To meet these requirements, Patent Documents 1-3 suggest etching resist resin compositions which contain a compound having a carboxylic group and a (meth)acryloyl group in the molecule. In these Documents, resin films obtained by curing of the compositions are said to exhibit high etching resistance and high alkali developability, and the compositions are applied onto metal plates by gravure printing or spay coating.

In the above manufacturing method, a resist pattern is prepared and then an etching resist resin is exposed through the resist pattern. The use of resist pattern enables efficient mass production of etched metal plates, rendering the manufacturing method fit for mass production. However, this method is not suited for the production of various kinds of etched metal plates in small lots.

Thus, for the manufacturing of printed wiring boards where resist etching resin is used as in the case of manufacturing of etched metal plates, methods have been suggested in which inkjet printing is employed for the direct printing of a resist pattern on a metal plate (see Patent Documents 4-7).

The manufacturing methods disclosed by these documents realize direct masking of metal plates using CAD image data or other image data without requiring any mask or screen printing plate, thereby eliminating the need to prepare a resist pattern and achieving high workability as well as quickly response to design change. This lends themselves particularly to manufacturing of various kinds of printed wiring boards in small lots. Moreover, the manufacturing methods are believed to offer excellent environmental compatibility, because no development process is needed as direct resist pattern printing is made possible.

Patent Documents 8 and 9 disclose phenoxyethylacrylate-containing inkjet ink compositions, which are disclosed as offering excellent nozzle ejection stability and curability, as well as imparting high processability to cured articles. Patent Document 10 discloses ink compositions which contain a polymerizable compound having phosphoric group, which are said to have high adhesion to recording media.

[Patent Document 1] Japanese Patent Application Laid-Open No. H05-100423
[Patent Document 2] Japanese Patent Application Laid-Open No. H07-76663
[Patent Document 3] Japanese Patent Application Laid-Open No. 2002-129079
[Patent Document 4] Japanese Patent Application Laid-Open No. S56-66089
[Patent Document 5] Japanese Patent Application Laid-Open No. S56-157089
[Patent Document 6] Japanese Patent Application Laid-Open No. S58-50794
[Patent Document 7] Examined Patent Publication No. S59-41320
[Patent Document 8] Japanese Patent Application Laid-Open No. 2002-241647
[Patent Document 9] Japanese Patent Application Laid-Open No. 2007-131755
[Patent Document 10] Japanese Patent Application Laid-Open No. 2006-328227

DISCLOSURE OF INVENTION

Problems to be Solved by the Invention

Neither of Patent Documents 1-3 discloses using, as inkjet ink, the etching resist resin composition which contains a compound having a carboxylic group and a (meth)acryloyl group in the molecule. The inventors tested this composition for its suitability as inkjet ink, and found that droplet ejection was difficult with them.

The inventors also prepared cured films from the inkjet ink compositions disclosed by Patent Documents 4-9 and from the ink composition disclosed by Patent Document 10 by inkjet printing, and evaluated their performance as etching resist. These cured films were found to exhibit unsatisfactory levels of performance—adhesion to metal plate, etchant resistance, and alkali developability.

Under the circumstance described above, the present invention is aimed at providing inkjet ink compositions for etching resist which can provide cured articles having excellent adhesion to metal plate, etchant resistance and alkali developability, and which can be stably ejected by inkjet printing.

Means for Solving the Problem

The inventors have conducted extensive studies and established that the foregoing objective can be achieved with an ink composition characterized in that:

(a) the ink composition contains specific amounts of (1-1) specific polymerizable phosphate compound or (1-2) specific polymerizable ester compound, (2) specific polyfunctional monomer which has two or more ethylenic double bonds and has no phosphoester group in the molecule, and (3) monofunctional monomer which has one ethylenic double bond and has neither phosphoester group nor carboxylic group in the molecule; and (b) the ink composition has a viscosity that falls within a specific range at 25° C. Specifically, the foregoing objective can be achieved by the inventions given below.

[1] An inkjet ink composition for etching resist including polymerizable monomers which can be polymerized by irradiation with an active energy ray, wherein the composition has a viscosity at 25° C. of 3-50 mPa·s, and the polymerizable monomers include, based on total monomers:

0.5-13 mass % of polymerizable phosphate compound having a phosphoester group and an ethylenic double bond in the molecule thereof;

10-75 mass % of polyfunctional monomer which has two or more ethylenic double bonds and has no phosphoester group in the molecule thereof, the ethylenic double bond amount being $4 \times 10^{-3}$ to $8 \times 10^{-3}$ mol/g; and 10-75 mass % of monofunctional monomer which has one ethylenic double bond and has neither phosphoester group nor carboxylic group in the molecule thereof.

[2] The composition according to [1], wherein the polymerizable phosphate compound has any one of the following general formulas (A1) to (A4).

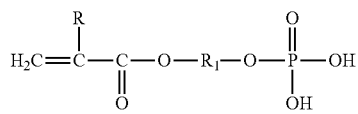
(A1)

where R represents hydrogen or methyl, and $R_1$ represents $C_{1-4}$alkylene

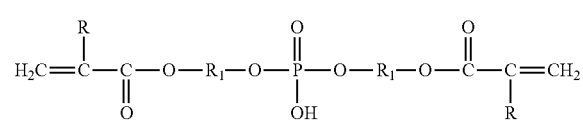
(A2)

where R's independently represent hydrogen or methyl, and $R_1$'s independently represent $C_{1-4}$alkylene

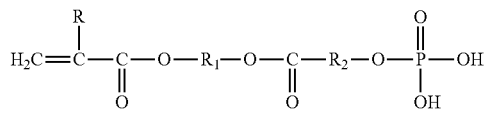
(A3)

where R represents hydrogen or methyl, $R_1$ represents $C_{1-4}$alkylene, and $R_2$ represents $C_{1-10}$alkylene

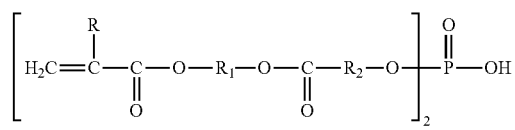
(A4)

where R represents hydrogen or methyl, $R_1$ represents $C_{1-4}$alkylene, and $R_2$ represents $C_{1-10}$alkylene

[3] An inkjet ink composition for etching resist including polymerizable monomers which can be polymerized by irradiation with an active energy ray, wherein the composition has a viscosity at 25° C. of 3-50 mPa·s, and the polymerizable monomers include, based on total monomers:

1-30 mass % of polymerizable ester compound having the following general formula (I);

10-75 mass % of polyfunctional monomer which has two or more ethylenic double bonds and has no phosphoester group in the molecule thereof, the ethylenic double bond amount being $4 \times 10^{-3}$ to $8 \times 10^{-3}$ mol/g; and 10-75 mass % of monofunctional monomer which has one ethylenic double bond and has neither phosphoester group nor carboxylic group in the molecule thereof.

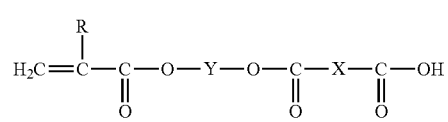
(I)

where X represents $C_{1-3}$alkylene, Y represents $C_{2-3}$alkylene, and R represents hydrogen or methy1

[4] The composition according to [3], wherein the polymerizable monomers further include, based on the total monomers, 3-10 mass % of polymerizable phosphate compound having a phosphoester group and an ethylenic double bond in the molecule thereof.

[5] The composition according to [3] or [4], wherein the polymerizable ester compound is a compound having general formula (I) where X is ethylene.

[6] The composition according to any one of [1] to [5], wherein the polyfunctional monomer has the following general formula (B1) or (B2).

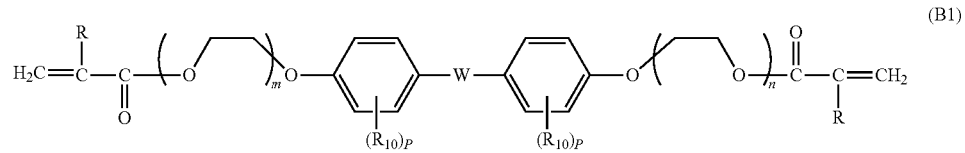
(B1)

where R's independently represent hydrogen or methyl, $R_{10}$'s independently represent $C_{1-5}$alkyl, P represents an integer of 0-4, W represents a single bond, methylene or isopropylidene, and n and m each represent an integer of 0-6

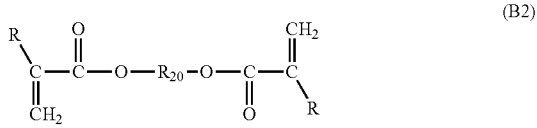

(B2)

where R's independently represent hydrogen or methyl, and $R_{20}$ represents $C_{3-9}$alkylene

[7] A method of manufacturing an etched metal plate including:
  ejecting the ink composition according to any one of [1] to [6] onto a metal plate;
  curing the ink composition by irradiation with an active energy ray;
  etching a surface of the metal plate obtained form the preceding process; and
  removing the cured composition by treating the etched metal plate with alkali solution.

Advantageous Effects Of Invention

The present invention can provide inkjet ink compositions which can provide cured articles having excellent adhesion to metal plate, etchant resistance and alkali developability, and which can be stably ejected by inkjet printing.

BEST MODE FOR CARRYING OUT THE INVENTION

1. First inkjet ink composition for etching resist

A first inkjet ink composition for etching resist (hereinafter also "first ink composition") of the present invention contains polymerizable monomers which can be polymerized by irradiation with an active energy ray. The polymerizable monomers include, based on total monomers, (1-1) 0.5-13 mass % of polymerizable phosphate compound having a phosphoester group and an ethylenic double bond in the molecule; (2) 10-75 mass % of polyfunctional monomer which has two or more ethylenic double bonds and has no phosphoester group in the molecule, wherein the ethylenic double bond amount is $4\times10^{-3}$ to $8\times10^{-3}$ mol/g; and (3) 10-75 mass % of monofunctional monomer which has one ethylenic double bond and has neither phosphoester group nor carboxylic group in the molecule. The first inkjet ink composition has a viscosity at 25° C. of 3-50 mPa·s. In the description, the ranges are inclusive at both ends.

(1-1) Polymerizable phosphate compound

Polymerizable phosphate compound refers to a compound which has a phosphoester group and an ethylenic double bond in the molecule. Polymerizable phosphate compounds improves adhesion to metal more markedly than carboxyl-containing compounds; only a small amount is required to improve adhesion to metal, and therefore, the ink composition containing the polymerizable phosphate compound can have low viscosity. Thus, ink composition of the present invention which contains a polymerizable phosphate compound exhibits improved etchant resistance and alkali developability without entailing viscosity increase.

Phosphoester group refers to a group having any one of the following formulas (a1)-(a3). Preferably, the phosphoester group used in the present invention is the group having the formula (a2) or (a3), i.e., acidic phosphoester group. This is because these acidic phosphoester groups improve adhesion to metal, due in part to the presence of hydroxyl group that undergoes condensation with a hydroxyl group attached to the metal surface. Composition which contains a compound having the phosphoester group having formula (a3) gives cured article which is particularly excellent in adhesion to metal. Composition which contains a compound having the phosphoester group having formula (a2) has the advantage of significantly low viscosity. Thus, the structure of the phosphoester group may be appropriately selected depending on the desired physical properties. The phosphoester group also improves alkali developability of a cured article.

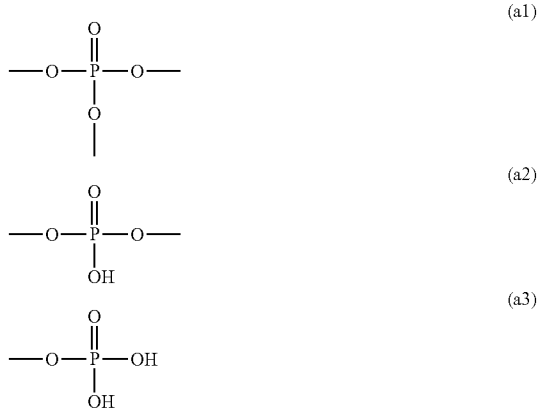

Commercially available polymerizable phosphate compounds may be employed. Alternatively, the compounds can be prepared by esterification of compounds having a (meth) acryloyl group and a hydroxyl group with phosphoric acid.

Examples of compounds having (meth)acryloyl group and hydroxyl group in the molecule include hydroxyalkyl(meth) acrylates such as 2-hydroxymethyl(meth)acrylate, 2-hydroxypropyl(meth)acrylate, 2-hydroxybutyl(meth)acrylate, 4-hydroxybutyl (meth)acrylate, 1,4-cyclohexanedimethanol mono(meth)acrylate; and (Poly)ethylene glycol (meth)acrylates such as ethylene glycol (meth)acrylate, diethylene glycol (meth)acrylate, triethylene glycol (meth)acrylate, and tetraethylene glycol (meth)acrylate.

Of these, compounds having the following formula (A1), (A2), (A3) or (A4) are preferable as the polymerizable phosphate compounds used in the present invention, for their high adhesion to metal and high alkali developability, as well as for availability.

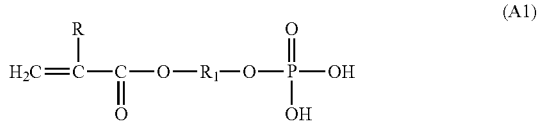

(A1)

In formula (A1), R represents hydrogen or methyl, and $R_1$ represents $C_{1-4}$alkylene. R preferably represents methyl because low viscosity is achieved in the resultant ink composition. $R_1$ preferably represents ethylene because it provides a good balance of adhesion to metal and alkali developability. Compound having formula (A1) where $R_1$ is ethylene is also referred to as 2-(meth)acryloyloxyethyl acid phosphate.

(A2)

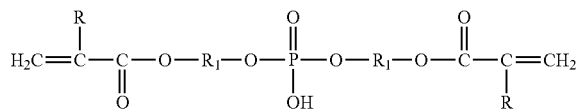

In formula (A2), R''s independently represent hydrogen or methyl, and $R_1$'s independently represent $C_{1-4}$alkylene. R' s preferably represent methyl because low viscosity is achieved in the resultant ink composition. $R_1$'s preferably represent ethylene because it provides a good balance of adhesion to metal and alkali developability. Compound having formula (A2) where $R_1$ is ethylene is also referred to as di[2-(meth) acryloyloxyethyl] acid phosphate.

(A3)

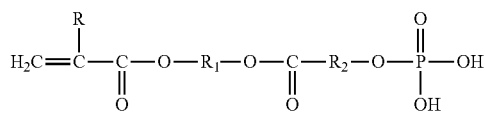

In formula (A3), R represents hydrogen or methyl, $R_1$ represents $C_{1-4}$alkylene, and $R_2$ represents $C_{1-10}$alkylene. R preferably represents methyl because low viscosity is achieved in the resultant ink composition. $R_1$ preferably represent ethylene because it provides a good balance of adhesion to metal and alkali developability. $R_2$ preferably represents pentylene.

(A4)

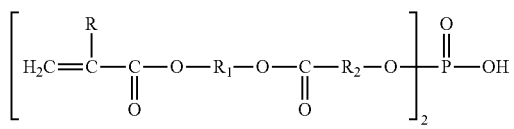

In formula (A4), R''s independently represent hydrogen or methyl, $R_1$'s independently represent $C_{1-4}$alkylene, and $R_2$'s independently represent $C_{1-4}$alkylene. R's preferably represent methyl because low viscosity is achieved in the resultant ink composition. $R_1$'s preferably represent ethylene because it provides good a balance of adhesion to metal and alkali developability. $R_2$s preferably represent pentylene.

The first ink composition contains 0.5-13 mass % of polymerizable phosphate compound based on the total monomers. If the amount of the polymerizable phosphate compound is less than 0.5 mass %, a cured article of the ink composition (hereinafter also "cured film") exhibits insufficient adhesion to metal. On the other hand, if the amount of the polymerizable phosphate compound is greater than 13 mass %, the resultant cured article exhibits insufficient etchant resistance. More preferably, the amount of the polymerizable phosphate compound is 1-13 mass % as it is possible to provide a good balance among adhesion to metal plate, etchant resistance, alkali developability, and ink composition viscosity.

(2) Polyfunctional monomer

The first ink composition contains 10-75 mass % of polyfunctional monomer (hereinafter also "specific polyfunctional monomer") based on the total monomers. The polyfunctional monomer has two or more ethylenic double bonds and has no phosphoester group in the molecule, wherein the ethylenic double bond amount is $4 \times 10^{-3}$ to $8 \times 10^{-3}$ mol/g. Examples of the specific polyfunctional monomer include compounds having 2-6 ethylenic double bonds in the molecule. Of these, compounds having two or more (meth)acryloyl groups in the molecule are preferable because they are readily available as well as are prone to polymerization by irradiation with an active energy ray.

Ethylenic double bond amount is defined as "ethylenic double bond amount/monomer's molecular weight" expressed in units of mol/g. For the specific polyfunctional monomer used in the present invention, it is only necessary to employ one kind of such a polyfunctional monomer whose ethylenic double bond amount falls within the above range. Alternatively, two or more different specific polyfunctional monomers whose ethylenic double bond amount falls within the above range, or two or more different polyfunctional monomers whose ethylenic double bond amount does not fall within the above range may be combined, such that the net ethylenic double bond amount falls within the above range.

When two or more different polyfunctional monomers are to be combined, the ethylenic double bond amount in the ink composition is found as follows: For example, when the following monomers x, y and z are to be used, ethylenic double bond amount can be calculated using Equation (1) below.

Monomer x: Number of ethylenic double bonds=Nx; Molecular weight=Mx (g/mol); Blending ratio=x (mass %)

Monomer y: Number of ethylenic double bonds=Ny; Molecular weight=My (g/mol); Blending ratio=y (mass %)

Monomer z: Number of ethylenic double bonds=Nz; Molecular weight=Mz (g/mol); Blending ratio=z (mass %)

Ethylenic double bond amount in ink composition=
$(Nx)/(Mx) \times x/100 + (Ny)/(My) \times y/100 + (Nz)/(Mz) \times z/100$  Equation (1)

When the ink composition contains a polyfunctional monomer, crosslink density increases so as to increase the hardness of the resultant cured film. However, when crosslink density is too high, the composition may become too chemically stable to cause reduction in etchant resistance and alkali developability. Because of the presence of a specific polyfunctional monomer whose ethylenic double bond amount is adjusted to fall within the specific range, the ink composition of the present invention imparts a good balance of hardness, etchant resistance and alkali developability to a cured film.

The specific polyfunctional monomer contained in the first ink composition can be selected from any known polyfunctional monomers; however, it is preferable to use compounds having the following general formula (B1) or (B2).

(B1)

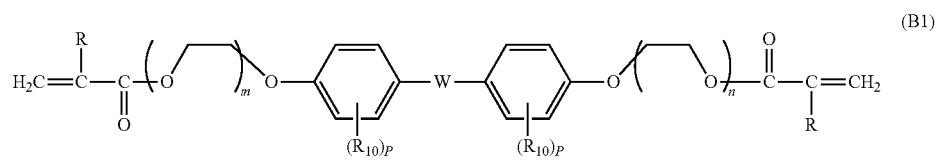

In general formula (B1), R's independently represent hydrogen or methyl; $R_{10}$'s independently represent $C_{1-4}$alkyl; P represents an integer of 0-4, representing the number of substituent $R_{10}$ attached to the benzene ring; W represents a single bond, methylene or isopropylidene; and n and m each represent an integer of 0-6.

The compounds having general formula (B1) are available as (meth)acrylates of ethylene glycol-modified bisphenol. In the present invention, the compounds are preferably obtained by reacting ethylene glycol-modified bisphenol with acrylic acid, wherein the sum of n and m is preferably 3-5, more preferably 4.

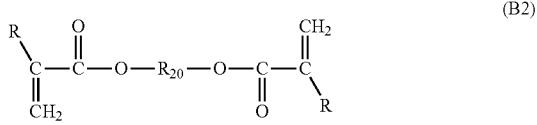
(B2)

In general formula (B2), R's independently represent hydrogen or methyl, and $R_{20}$ represents $C_{3-9}$alkylene. The alkylenes include their isoforms. In the present invention, $R_{20}$ is preferably hexylene or pentylene.

The amount of the specific polyfunctional monomer is 10-75 mass %, preferably 55-65 mass %, of the total monomers.

(3) Monofunctional monomer

The first ink composition contains 10-75 mass % of monofunctional monomer which has one ethylenic double bond and has neither phosphoester group nor carboxylic group in the molecule. Examples of the monofunctional monomer include the following compounds:

2-phenoxyethyl acrylate, acryloylmorpholine, N-vinylcaprolactam, 2-hydroxyethyl acrylate, 2-hydroxypropyl acrylate, 4-hydroxybutyl acrylate, isobutyl acrylate, t-butyl acrylate, isooctyl acrylate, isobornyl acrylate, cyclohexyl acrylate, dodecyl acrylate, 2-methoxyethyl acrylate, methoxytriethylene glycol acrylate, 2-ethoxyethyl acrylate, tetrahydrofurfuryl acrylate, 3-methoxybutyl acrylate, benzyl acrylate, ethoxyethyl acrylate, butoxyethyl acrylate, ethoxydiethylene glycol acrylate, methoxydipropylene glycol acrylate, methylphenoxyethyl acrylate, and dipropylene glycol acrylate.

Of these, compounds having a (meth)acryloyl group in the molecule are preferable as the monofunctional monomer; compounds having the general formula (C1) or (C2) are preferable. This is because these compounds are readily available as well as are more likely to be polymerized by irradiation with an active energy ray.

(C1)

In general formula (C1), $R_{30}$ represents alkyl, preferably $C_{8-15}$alkyl. The alkyls include their isoforms. R represents hydrogen or methyl; however, hydrogen is preferable because the compound has less steric hindrance and is more likely to undergo radical polymerization.

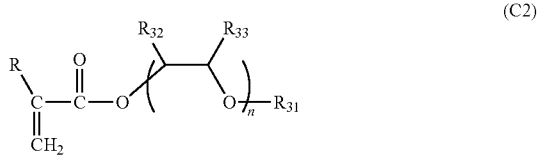
(C2)

In general formula (C2), $R_{31}$ represents alkyl, preferably methyl or ethyl; $R_{32}$ and $R_{33}$ independently represent hydrogen or methyl; n represents an integer of 1-3, preferably 2 or 3; and R represents hydrogen or methyl; however, hydrogen is preferable because the compound has less steric hindrance and is more likely to undergo radical polymerization.

These compounds may be used alone or in combination. Ink composition containing such a monofunctional monomer exhibits low viscosity and thus stable inkjet ejection is made possible. The amount of the monofunctional monomer is 10-75 mass % of the total monomers.

If the amount of the monofunctional monomer is less than 10 mass %, the ink composition exhibits high viscosity and thus inkjet ejection may become difficult. If the monofunctional monomer content exceeds 75 mass %, on the other hand, the resultant cured film may exhibit low etchant resistance.

(4) Photoinitiator

The first ink composition preferably contains a photoinitiator. The photoinitiator may be either of intramolecular bond cleavage type or of intermolecular hydrogen abstraction type.

Examples of intramolecular bond cleavage type photoinitiators include benzoin compounds such as diethoxyacetophenone, 2-hydroxy-2-methyl-1-phenylpropane-1-one, benzyl dimethyl ketal, 1-(4-isopropylphenyl)-2-hydroxy-2-methylpropane-1-one, 4-(2-hydroxyethoxy)phenyl-(2-hydroxy-2-propyl)ketone, 1-hydroxycyclohexyl phenyl ketone, 2-methyl-2-morpholino(4-thiomethylphenyl)propane-1-one, and 2-benzyl-2-dimethylamino-1-(4-morpholinophenyl)-butanone; acylphosphine oxide compounds such as 2,4,6-trimethylbenzoindiphenylphosphine oxide; and methylphenyl glyoxyesters.

Examples of intermolecular hydrogen abstraction type photoinitiators include benzophenone compounds such as benzophenone, methyl o-benzoylbenzoate-4-phenylbenzophenone, 4,4'-dichlorobenzophenone, hydroxybenzophenone, 4-benzoyl-4'-methyl-diphenylsulfide, acrylated benzophenone, 3,3',4,4'-tetra(t-butylperfoxycarbonyl)benzophenone, and 3,3'-dimethyl-4-methoxybenzophenone; thioxanthone compounds such as 2-isopropylthioxanthone, 2,4-dichlorothioxanthone, 2,4-diethylthioxanthone, and isopropylthioxanthone; aminobenzophenone compounds such as Michler's ketone, and 4,4'-diethylaminobenzophenone; 10-butyl-2-chloroacridone; 2-ethylanthraquinone; 9,10-phenanthrenequinone; and camphorquinone.

The added amount of a photoinitiator is preferably 0.01-15.0 mass % of the first ink composition.

The first ink composition may further contain a photosensitizer to facilitate curing reaction. Examples of photosenstizers include amine compounds such as triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, n-butoxyethyl 4-dimethylaminobenzoate, and 2-ethylhexyl 4-dimethylaminobenzoate. The added amount of a photosensitizer is preferably 0.01-10.0 mass % of the ink composition.

(5) Additional additives

As needed, the first ink composition may further contain compounds other than those described above which do not react with other components in the ink composition, resins, inorganic fillers, organic fillers, coupling agents, adhesives, antifoaming agents, leveling agents, plasticizers, antioxidants, polymerization inhibitors, UV absorbers, flame retardants, pigments, and/or dyes.

The first ink composition needs not to be colored, but may be colored when checking print quality e.g., generation of pinholes. There are no particular limitations to coloring pigments used for print quality check; however, it is preferable to employ dyes, which are more soluble in contrast to pigments that need dispersing.

The first ink composition requires substantially no solvent to be added, but may contain ketone such as methyl ethyl ketone or methyl isobutyl ketone; acetate such as ethyl acetate or butyl acetate; aromatic hydrocarbon such as benzene, toluene or xylene; alcohol such as ethylene glycol monoacetate, propylene glycol monoethylether or butyl alcohol; and/or other generally used organic solvent.

(6) Viscosity

The first ink composition has a viscosity at 25° C. of 3-50 mPa·s. Preferably, the first ink composition has a viscosity of 3-35 mPa·s, more preferably 7-20 mPa·s, at 25-80° C., a temperature range that is generally considered as where inkjet ejection is performed. Ink compositions whose viscosity falls within the above range in the above temperature range can be stably ejected by inkjet printing (i.e., exhibit excellent jettability). If the viscosity at 25° C. is less than 3 mPa·s, the patterning accuracy of the ink droplets ejected from a piezoelectric inkjet head at a frequency of as high as 10-50 kHz. On the other hand, if the viscosity at 25° C. exceeds 50 mPa·s, ink ejection may become unstable even when a heater is placed on the inkjet head. Viscosity can be adjusted by adjusting the amount of polymerizable phosphate compound. For viscosity measurement it is preferable to use cone/plate viscometer TVE-22L (Toki Sangyo Co., Ltd.) using a cone rotor (1° 34'×R24) at 60 rpm.

(7) Surface tension

The first ink composition preferably has a surface tension of 20-40 mN/m. Surface tension influences the jettability of ink from the inkjet head and the resolution of the pattern printed on the metal plate. Ink compositions whose surface tension falls within the above range exhibit excellent jettability and resolution. Surface tension is adjusted in any known way, e.g., through the addition of a surfactant. Surface tension may be measured with any known method, e.g., by pendant drop method or ring method, but is preferably measure by plate method. Measurement can be made using CBVP-Z surface tensiometer (Kyowa Interface Science Co., Ltd.), for example.

2. Second inkjet ink composition for etching resist

A second inkjet ink composition of the present invention contains polymerizable monomers which can be polymerized by irradiation with an active energy ray. The polymerizable monomers include, based on the total monomers, (1-2) 1-30 mass % of polymerizable ester compound having general formula (I); (2) 10-75 mass % of polyfunctional monomer which has two or more ethylenic double bonds and has no phosphoester group in the molecule, wherein the ethylenic double bond amount is $4\times10^{-3}$ to $8\times10^{-3}$ mol/g; and (3) 10-75 mass % of monofunctional monomer which has one ethylenic double bond and has neither phosphoester group nor carboxylic group in the molecule. The second inkjet ink composition has a viscosity at 25° C. of 3-50 mPa·s.

(1-2) Polymerizable ester compound

The second ink composition contains 1-30 mass % polymerizable ester compound having general formula (I) based on the total monomers.

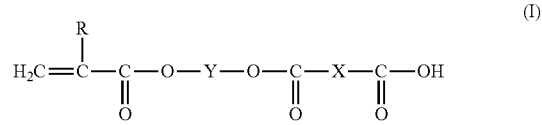

Polymerizable ester compounds having general formula (I) (hereinafter also "polymerizable ester compounds used in the present invention") give cured articles which exhibit excellent adhesion to metal, etchant resistance, and alkali developability. Enhanced adhesion to metal is considered to be due to bonds formed by reaction of carboxyl groups of the polymerizable ester compound with hydroxyl groups present on the metal surface. Enhanced etchant resistance is considered to be derived from the etchant-resistant structure of the polymerizable ester compound, as well as from the crosslinked structure formed with other monomer that imparts hardness to the cured article. Enhanced alkali developability is considered to be derived from the alkali hydrolysis of the carboxylic groups or carboxyl-derived ester groups of the polymerizable ester compound.

Polymerizable ester compounds used in the present invention tend to undergo intramolecular association as illustrated by formula (1) below and, therefore, are less likely to form a dimer with another molecule unlike other general carboxyl-containing compounds (see formula (2) below). Thus, even when the polymerizable ester compound used in the present invention is added in the ink composition in such an amount enough to enhance adhesion to metal, etchant resistant and alkali developability, it hardly increases composition's viscosity.

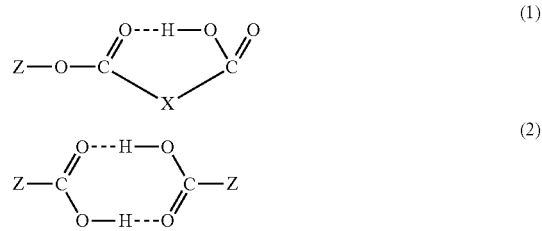

In formulas (1) and (2), Z represents an arbitrary organic group, and X represents $C_{1-3}$alkylene.

In general formula (I), X represents $C_{1-3}$alkylene. When X is $C_1$alkylene, the carbonyl group and carboxyl group easily come close together and thus intramolecular association shown in FIG. 1) is more likely to occur. When X is $C_{2-3}$alkylene, the carbonyl group and carboxyl group are somewhat far from each other. However, because rotation is possible about the carbon-carbon bond of alkylene, intramolecular association tends to occur.

By contrast, when X is $C_4$alkylene or longer chain alkylene, the carbonyl group and carboxyl group are separated so far that intramolecular association becomes less likely to occur. Moreover, when X is an aromatic hydrocarbon such as 1,2-phenylene, rotation cannot occur between the two carbonyl groups attached to the aromatic ring. Thus, similarly, intramolecular association becomes less likely to occur. As described above, compounds that are less likely to undergo intramolecular association tend to form dimers with other molecules, as illustrated by formula (2).

Examples of $C_{1-3}$alkylenes include methylene, ethylene, propylene, isopropylene, and isopropylidene. Of these, X is preferably methylene or ethylene, most preferably ethylene, in view of high likelihood of intarmolecular association.

Polymerizable ester compounds used in the present invention where X is methylene are called malonate compounds, polymerizable ester compounds used in the present invention where X is ethylene are called succinate compounds, and polymerizable ester compounds used in the present invention where X is propylene are called glutarate compounds.

In general formula (1), Y represents $C_{2-3}$alkylene. Examples of $C_{2-3}$alkylenes include ethylene, propylene, isopropylene, and isopropylidene. As described above, the carboxyl group bonds to the metal surface, and the polymerizable functional group is polymerized with polymerizable functional groups of other monomers. The molecular weight of the moiety between the polymerizable functional group and carboxyl group increases with increasing number of the carbon atoms of Y. Thus, the distance between the metal bonding site and the polymerization site becomes large. As a result, infiltration of etchant into the cured article through this space is facilitated in some cases, resulting reduced etchant resistance in the cured article. To avoid this, Y is preferably ethylene. R represents hydrogen or methyl.

Specific examples of polymerizable ester compounds used in the present invention include 2-(acryloyloxy)ethyl succinate, 2-(methacryloyloxy)ethyl succinate, 2-(acryloyloxy)propyl succinate, 2-(acryloyloxy)ethyl malonate, and 2-(acryloyloxy)ethyl glutarate. In the present invention, viscosity is measured at 25° C. with any known cone/plate viscometer. It is preferable to measure viscosity with cone/plate viscometer TVE-22L (Toki Sangyo Co., Ltd.) using a cone rotor (1° 34'×R24) at 60 rpm.

2-(acryloyloxy)ethyl succinate has a viscosity at 25° C. of 180 mPa·s, and 2-(methacryloyloxy)ethyl succinate has a viscosity at 25° C. of 160 mPa·s. On the other hand, 2-(acryloyloxy)ethyl hexahydrophthalate, which is a polymerizable ester compound different from the compound having general formula (1), has a viscosity at 25° C. of around 4,000 mPa·s, a value much higher than the viscosities of the polymerizable ester compounds used in the present invention.

The polymerizable ester compounds used in the present invention may be purchased ready-made, but can also be synthesized through the following steps, for example.

1) A dicarboxylic acid such as succinic acid is reacted with a diol such as ethylene glycol to produce a monoester; and 2) The monoester prepared in the above step is reacted with acrylic acid or methacrylic acid.

These steps may be carried out using normal methods.

The amount of the polymerizable ester compound used in the present invention is preferably 1-30 mass %, more preferably 10-30 mass %, of the total monomers of the second ink composition. In particular, when the second ink composition is free of the above (1-1) polymerizable phosphate compound, the amount of the polymerizable ester compound is preferably 10-30 mass %.

The second ink composition may contain the (1-1) polymerizable phosphate compound. In this case, the amount of the polymerizable ester compound is preferably 1-10 mass % of the total monomers.

(2) Polyfunctional monomer

The second ink composition contains 10-75 mass % (2) specific polyfunctional monomer described above, based on the total monomers. This provides the same effect as that for the first ink composition.

As in the case of the first ink composition, the specific polyfunctional monomer is preferably a compound having general formula (B1) or (B2) above.

The amount of the specific polyfunctional monomer is 10-75 mass %, more preferably 55-65 mass %, of the total monomers.

(3) Monofunctional monomer

The second ink composition contains 10-75 mass % (3) monofunctional monomer described above. This provides the same effect as that for the first ink composition.

It is preferable to use the same monofunctional monomer as that for the first ink composition. The specific polyfunctional monomer is preferably selected from compounds having general formula (B1) or (B2) above.

(4) Photoinitiator

The second ink composition preferably contains a photoinitiator. The second ink composition preferably contains the same kind and same amount of photoinitiator as the first ink composition.

The second ink composition may contain a photosensitizer as with the first ink composition. The second ink composition preferably contains the same kind and same amount of photosensitizer as the first ink composition.

(6) Additional additives

As in the case of the first ink composition, the second ink composition may further contain additional additives as needed.

The second ink composition may be colored and/or may contain an organic solvent, as in the case of the first ink composition.

(7) Viscosity

The second ink composition has a viscosity at 25 T of 3-50 mPa·s. Preferably, the second ink composition has a viscosity of 3-35 mPa·s; more preferably 7-20 mPa·s, at 25-80° C., a temperature range that is generally considered as where inkjet ejection is performed. This provides the same effect as that for the first ink composition.

(8) Surface tension

The second ink composition preferably has a surface tension of 20-40 mN/m. This provides the same effect as that for the first ink composition.

3. Production method of ink composition of the present invention

An ink composition of the present invention is produced by dispersing or dissolving component materials with a mixer, disperser or stirrer. Examples of these devices include screw stirrer, dissolver, homomixer, ball mill, sand mill, sonicator, kneader, line mixer, piston-type high-pressure emulsifier, ultrasonic emulsifier, pressure nozzle-type emulsifier, high-speed, high-shear homogenizer, colloid mill, and media disperser. Media disperser is a grinding/dispersing device which uses grinding/dispersing media such as glass beads or steel balls; examples thereof include sand grinder, agitator mill, ball mill, and atritor. The media dispersers may be combined for use. It is also possible to use the mixer, disperser and stirrer in any combination. The ink composition is preferably filtered through a filter with a pore size of 3 μm or less, preferably 1 μm or less.

4. Manufacturing method of etched metal plate

Etched metal plates can be manufactured using ink compositions of the present invention. An etched metal plate may be manufactured with any desired method unless the effect of the present invention is impaired, but is preferably manufactured by the following method which includes the steps of:

(a) ejecting an ink composition of the present invention onto a metal plate;

(b) curing the ink composition by irradiation with an active energy ray;

(c) etching the surface of the metal plate obtained from preceding process; and (d) removing the cured composition by treating the etched metal plate with alkali solution.

In step (a), an ink composition of the present invention is applied onto a metal plate using a typical inkjet printer. The inkjet printer preferably includes an ink composition supply unit, a temperature sensor, and an active energy ray irradiation unit. The ink composition supply unit preferably includes a source tank filled with ink composition, a supply duct, a piezoelectric inkjet head, an ink supply tank arranged in front of the inkjet head, and a filter. The piezoelectric inkjet head preferably allows ejection of multi-sized dots in amounts of 1-100 pl, with resolution preferably ranging from 320×320 dpi to 4,000×4,000 dpi. The term "dpi" means the number of dots per inch (2.54 cm).

Ejection of the ink composition is preferably carried out while heating the inkjet head and ink composition to 35-100° C. Because viscosity changes due to temperature changes affect image quality, it is preferable to heat the ink composition and keep the temperature constant. The ink composition temperature is preferably controlled within 5° C. of the set temperature, more preferably within 2° C. of the set temperature, further preferably within 1° C. of the set temperature.

The metal plate can be selected from austenite stainless steel plates such as SUS304 and SUS316 and ferrite stainless steel plates such as SUS410 and SUS430. For applications where mechanical strength is required, it is preferable to use cold-rolled austenite or ferrite stainless steel plates, martensite stainless steel plates such as SUS420, and precipitation hardening stainless steel plates such as SUS631. In addition to stainless steels plates, it is possible to use copper plates, carbon steel plates, and iron-nickel alloy plates.

In step (b), the ink composition is cured by irradiation with an active energy ray. Active energy ray means infrared ray, visible ray, ultraviolet ray, X-ray, electron beam, alpha-ray, beta-ray, gamma-ray, and the like. Suitable active energy ray sources herein include mercury lamps, low-pressure mercury lamps, low-pressure solid lasers, xenon flash lamps, black lights, sterilizing lamps, cold-cathode tubes, light emitting diodes (LED), and laser diodes (LD).

In the present invention, it is preferable to use a metal halide lamp emitting light of 320-390 nm wavelength as an active energy ray source. Moreover, GaN-based ultraviolet LEDs or LDs are preferable in view of environmental protection for the absence of mercury. Ultraviolet LDs are small, long life, high-efficient, and low-cost lasers and therefore have been expected as light sources for photo-curable inkjet inks.

Irradiation with active energy ray is preferably effected within 0.01-2.0 seconds, more preferably within 0.01-1.0 seconds, after deposition of ink composition onto the metal plate. The smaller the time interval, the higher the resolution of the pattern printed on the metal plate. It is also preferable to use an active energy ray with a maximum intensity of 500-3,000 mW/cm$^2$ over a curable wavelength range.

The total thickness of a cured film is preferably 2-20 µm. If the total film thickness is less than 2 µm, it may be difficult to ensure sufficient etchant resistance. On the other hand, if the total film thickness exceeds 20 µm, it may be difficult to obtain sufficiently high resolution. Optionally, as needed, the cured film may be subjected to heat treatment after irradiation with an active energy ray. Heat treatment may relieve internal stress in the film to enhance its adhesion to a metal plate.

In step (c), the surface of the metal plate from step (b) is etched. Etching may be effected by any known method, e.g., by immersion of the metal plate with $FeCl_3$ solution or the like.

In step (d), the etched metal plate is treated with alkali solution for the removal of the cured composition. This step may also be effected by any known method, e.g., by immersion of the metal plate with sodium hydroxide solution or the like.

EXAMPLES

Polymerizable mononers and photoinitiators given below were prepared.

[Compound Having Formula (A1)]

2-methacryloyloxyethyl acid phosphate ("LIGHT ESTER P-1M" available from Kyoeisha Chemical Co., Ltd.)

2-acryloyloxyethyl acid phosphate ("LIGHT ESTER P-1A" available from Kyoeisha Chemical Co., Ltd.)

[Compound Having Formula (A2)]

di[2-methacryloyloxyethyl] acid phosphate ("LIGHT ESTER P-2M" available from Kyoeisha Chemical Co., Ltd.)

[Mixture of Compound Having Formula (A3) and Compound Having Formula (A4)]

A mixture of compound having formula (A3) where R is methyl, $R_1$ is $C_2$alkylene and $R_2$ is $C_5$alkylene, and compound having formula (A4) where R is methyl, $R_1$ is $C_2$alkylene and $R_2$ is $C_5$alkylene ("KAYARAD PM-21" available from Nippon Kayaku Co., Ltd.)

[Polymerizable ester compound]

2-(acryloyloxy)ethyl succinate ("NK ESTER A-SA" available from Shin-Nakamura Chemical Co., Ltd.)

2-(methacryloyloxy)ethyl succinate ("NK ESTER SA" available from Shin-Nakamura Chemical Co., Ltd.)

[Polyfunctional monomer]

1.6-hexanediol diacrylate ("LIGHT ACRYLATE 1.6HX-A" available from Kyoeisha Chemical Co., Ltd.)

1.6-hexanediol diacrylate is bifunctional and has a molecular weight of 226. Thus, ethylenic double bond amount is found as: $2/226=8.8\times10^{-3}$ (mol/g).

EO-modified bisphenol A diacrylate (n+m≈4) ("LIGHT ACRYLATE BP-4EA" available from Kyoeisha Chemical Co., Ltd., a diacrylate in which the number of repeated ethylene oxide units n+m is about 4).

The EO-modified bisphenol A diacrylate is bifunctional and has a molecular weight of 512. Thus, ethylenic double bond amount is found as: $2/512=3.9\times10^{-3}$ (mol/g).

[Monofunctional monomer]

Dodecyl acrylate ("LIGHT ACRYLATE L-A" available from Kyoeisha Chemical Co., Ltd.)

Methoxydipropylene glycol acrylate ("LIGHT ACRYLATE DPM-A" available from Kyoeisha Chemical Co., Ltd.)

[Photoinitiator]

Benzophenone 1-hydroxycyclohexyl phenyl ketone ("IRGACURE 184" available from Ciba Specialty Chemicals Inc.)

[Polymerizable carboxylic acid compound]

2-(acryloyloxy)ethyl hexahydrophthalate ("LIGHT ACRYLATE HOA-HH" available from Kyoeisha Chemical Co., Ltd.)

2-(acryloyloxy)ethyl phthalate ("LIGHT ACRYLATE HOA-MPL" available from Kyoeisha Chemical Co., Ltd.)

Example 1-1

To a homomixer was added 5.4 parts by weight of di[2-methacryloyloxyethyl] acid phosphate, 32.6 parts by weight of 1,6-hexandioldiacrylate, 34.8 parts by weight of dodecyl acrylate, and 27.2 parts by weight of EO-modified bisphenol A diacrylate (n+m≈4). Under shaded condition, the mixture was heated to 35° C. in a dry air atmosphere and mixed for 1 hour. A photoinitiator was then added and gently mixed until it dissolves into the mixture. The mixture was press filtered through a 2 μm pore size membrane filter to obtain an ink composition. The viscosity at 25° C. of the ink composition was measured with cone/plate viscometer TVE-22L (Toki Sangyo Co., Ltd.).

The ethylenic double bond amount of the specific polyfunctional monomers contained in the composition is calculated as follows:

$$3.9E-3\times(27.2/(27.2+32.6))+8.8E-3\times(32.6/(27.2+32.6))=6.57\times10^{-3} \text{ (mol/g)}$$

Using an inkjet printer equipped with a piezoelectric inkjet head, the ink composition was ejected onto a 0.5 mm-thick SUS304 BA plate to print a 1 cm×5 cm image thereon.

About 0.4 seconds after printing, the metal plate was irradiated with UV light with UV irradiator (metal halide lamp M0151-L212, Eye Graphics Co., Ltd., 1 lamp: 120 W), to cure the ink composition to form a cured film. At this time, plate feed rate was set to 10 m/min, and UV irradiation was performed 4 times. The metal plate was heated at 120° C. for 15 minutes in an oven. The printed image had a uniform thickness of 8 μm. The metal plate was evaluated for the following properties.

1) Etchant resistance

The metal plate prepared above was soaked in 60° C. 43% conc. $FeCl_3$ aqueous solution for 30 minutes. Thereafter, the surface state of the cured film was visually evaluated based on the following criteria:

A: No change was observed

B: Coloring was observed

C: Bulging or separation was observed

2) Alkali developability

The metal plate subjected to etchant resistance test was soaked in 80° C. 10% conc. NaOH aqueous solution for 1 minute. Thereafter, the cured film was visually evaluated for dissolution or separation based on the following criteria:

A: Film was completely dissolved and separated

B: Film was not completely dissolved, but separated

C: Film was not separated

3) Adhesion

Before etchant resistance test, in accordance with JIS G3320, a lattice pattern of cuts was made in the cured film printed on the metal plate. An adhesive film was then attached to the cured film and peeled off, measuring the number of blocks remained on the metal film to evaluate the adhesion of the cured film to the metal plate. When at least 50 out of 100 blocks remain on the metal film, it is judged that adhesion meets the practical level.

Examples 1-2 to 1-13

Ink compositions were produced as in Example 1-1 using monomers and photoinitiators listed in Table 1. Using the ink compositions thus produced, metal plates with cured films were manufactured and evaluated as in Example 1-1. The results are shown in Table 1.

TABLE 1

| Components | | | Compound ID | Ex. 1-1 | Ex. 1-2 | Ex. 1-3 | Ex. 1-4 | Ex. 1-5 | Ex. 1-6 | Ex. 1-7 |
|---|---|---|---|---|---|---|---|---|---|---|
| Composition (mass %) | Polymerizable phosphate compound | A1 | 2-(methacryloyloxy)ethyl acid phosphate | — | — | 2.7 | 5.4 | — | — | — |
| | | | 2-(acryloyloxy)ethyl acid phosphate | — | — | — | — | 2.7 | — | — |
| | | A2 | di[2-(meth)acryloyloxyethyl] acid phosphate | 5.4 | 10.9 | 2.7 | 5.4 | 2.7 | — | 2.2 |
| | | | Mixture of Compounds (A3) and (A4) | — | — | — | — | — | 5.4 | — |
| | Polyfunctional monomer | | EO-modified bisphenol A diacrylate (n + m = 4) | 27.2 | 27.2 | 27.2 | 27.2 | 27.2 | 27.2 | 27.2 |
| | | | 1,6-hexandioldiacrylate | 32.6 | 32.6 | 32.6 | 32.6 | 32.6 | 32.6 | 32.6 |
| | Monofunctional monomer | | Dodecyl acrylate | 34.8 | 29.3 | 34.8 | 29.4 | 34.8 | 34.8 | 34.7 |
| | | | Methoxydipropylene glycol acrylate | — | — | — | — | — | — | — |
| | Polymerizable carboxylic acid compound | | 2-(acryloyloxy)ethyl hexahydrophthalate | — | — | — | — | — | — | — |
| | | | 2-(acryloyloxy)ethyl phthalate | — | — | — | — | — | — | 3.3 |
| | Photoinitiator | | Benzophenone | 4.3 | 4.3 | 4.3 | 4.3 | 4.3 | 4.3 | 4.3 |
| | | | 1-hydroxycyclohexyl phenyl ketone | 4.3 | 4.3 | 4.3 | 4.3 | 4.3 | 4.3 | 4.3 |
| | Ethylenic double bond amount [E-3 mol/g] | | | 6.6 | 6.6 | 6.6 | 6.6 | 6.6 | 6.6 | 6.6 |
| Physical properties | Viscosity (mPa · s) | | | 17.3 | 21.6 | 16.5 | 23.6 | 17.2 | 16.4 | 16.7 |
| | Adhesion to metal plate | | | 100/100 | 100/100 | 100/100 | 100/100 | 100/100 | 100/100 | 70/100 |
| | Etchant resistance | | | A | B | A | B | A | A | B |
| | Alkali developability | | | B | A | B | A | B | B | B |

| Components | | | Compound ID | Ex. 1-8 | Ex. 1-9 | Ex. 1-10 | Ex. 1-11 | Ex. 1-12 | Ex. 1-13 |
|---|---|---|---|---|---|---|---|---|---|
| Composition (mass %) | Polymerizable phosphate compound | A1 | 2-(methacryloyloxy)ethyl acid phosphate | 2.2 | — | — | — | — | — |
| | | | 2-(acryloyloxy)ethyl acid phosphate | — | — | — | — | — | — |
| | | A2 | di[2-(meth)acryloyloxyethyl] acid phosphate | — | 0.6 | 10.9 | 10.9 | 10.9 | 10.9 |

TABLE 1-continued

| | | | | | | | |
|---|---|---|---|---|---|---|---|
| | | Mixture of Compounds (A3) and (A4) | — | — | — | — | — | — |
| Polyfunctional monomer | | EO-modified bisphenol A diacrylate (n + m = 4) | 27.2 | 27.6 | 43.5 | 21.7 | 18.5 | 21 |
| | | 1,6-hexandioldiacrylate | 32.6 | 33.2 | 29.3 | 2.2 | 54.3 | 1 |
| Monofunctional monomer | | Dodecyl acrylate | 34.7 | 35.3 | 16.3 | 32.6 | 16.3 | 33.5 |
| | | Methoxydipropylene glycol acrylate | — | — | — | 32.6 | — | 33.6 |
| Polymerizable carboxylic acid compound | | 2-(acryloyloxy)ethyl hexahydrophthalate | 3.3 | — | — | — | — | — |
| | | 2-(acryloyloxy)ethyl phthalate | — | 3.3 | — | — | — | — |
| Photoinitiator | | Benzophenone | 4.3 | 4.4 | 4.3 | 4.3 | 4.3 | 4.3 |
| | | 1-hydroxycyclohexyl phenyl ketone | 4.3 | 4.4 | 4.3 | 4.3 | 4.3 | 4.3 |
| | Ethylenic double bond amount [E-3 mol/g] | | 6.6 | 6.6 | 5.9 | 4.4 | 7.6 | 4.1 |
| Physical properties | Viscosity (mPa·s) | | 17.9 | 16.0 | 43.1 | 11.8 | 16.1 | 11.5 |
| | Adhesion to metal plate | | 70/100 | 70/100 | 100/100 | 100/100 | 100/100 | 100/100 |
| | Etchant resistance | | B | A | A | B | B | B |
| | Alkali developability | | B | B | A | A | B | A |

Comparative Examples 1-1 to 1-13

Ink compositions were produced as in Example 1-1 using monomers and photoinitiators listed in Table 2. Using the ink compositions thus produced, metal plates with cured films were manufactured and evaluated as in Example 1-1. The results are shown in Table 2. In Comparative Examples 1-9 and 1-10, formation of cured films failed because viscosity was too high to enable inkjet printing; thus, evaluations of physical property could not be conducted. This is indicated by "-" in Table 2.

TABLE 2

| Components | | | Compound ID | Comp. Ex. 1-1 | Comp. Ex. 1-2 | Comp. Ex. 1-3 | Comp. Ex. 1-4 | Comp. Ex. 1-5 | Comp. Ex. 1-6 | Comp. Ex. 1-7 |
|---|---|---|---|---|---|---|---|---|---|---|
| Composition (mass %) | Polymerizable phosphate compound | A1 | 2-(methacryloyloxy)ethyl acid phosphate | — | — | — | — | — | — | — |
| | | | 2-(acryloyloxy)ethyl acid phosphate | — | — | — | — | — | — | — |
| | | A2 | di[2-(meth)acryloyloxyethyl] acid phosphate | — | — | — | — | — | — | 16.3 |
| | | | Mixture of Compounds (A3) and (A4) | — | — | — | — | — | — | — |
| | Polyfunctional monomer | | EO-modified bisphenol A diacrylate (n + m = 4) | 27.2 | 27.2 | 27.2 | 27.2 | 27.2 | 27.2 | 27.2 |
| | | | 1,6-hexandioldiacrylate | 32.6 | 32.6 | 32.6 | 32.6 | 32.6 | 32.6 | 32.6 |
| | Monofunctional monomer | | Dodecyl acrylate | 34.8 | 29.3 | 18.5 | 34.8 | 29.3 | 18.5 | 23.9 |
| | | | Methoxydipropylene glycol acrylate | — | — | — | — | — | — | — |
| | Polymerizable carboxylic acid compound | | 2-(acryloyloxy)ethyl hexahydrophthalate | 5.4 | 10.9 | 21.7 | — | — | — | — |
| | | | 2-(acryloyloxy)ethyl phthalate | — | — | — | 5.4 | 10.9 | 21.7 | — |
| | Photoinitiator | | Benzophenone | 4.3 | 4.3 | 4.3 | 4.3 | 4.3 | 4.3 | 4.3 |
| | | | 1-hydroxycyclohexyl phenyl ketone | 4.3 | 4.3 | 4.3 | 4.3 | 4.3 | 4.3 | 4.3 |
| | Ethylenic double bond amount [E-3 mol/g] | | | 6.6 | 6.6 | 6.6 | 6.6 | 6.6 | 6.6 | 6.6 |
| Physical properties | Viscosity (mPa·s) | | | 16.5 | 20.6 | 37.6 | 17.0 | 21.3 | 42.5 | 28.0 |
| | Adhesion to metal plate | | | 5/100 | 10/100 | 60/100 | 5/100 | 10/100 | 60/100 | 100/100 |
| | Etchant resistance | | | A | B | C | A | B | C | C |
| | Alkali developability | | | B | B | A | B | B | A | A |

| Components | | | Compound ID | Comp. Ex. 1-8 | Comp. Ex. 1-9 | Comp. Ex. 1- | Comp. Ex. 1-11 | Comp. Ex. 1-12 | Comp. Ex. 1-13 |
|---|---|---|---|---|---|---|---|---|---|
| Composition (mass %) | Polymerizable phosphate compound | A1 | 2-(methacryloyloxy)ethyl acid phosphate | — | — | — | — | — | — |
| | | | 2-(acryloyloxy)ethyl acid phosphate | — | — | — | — | — | — |
| | | A2 | di[2-(meth)acryloyloxyethyl] acid phosphate | 21.7 | 10.9 | 10.9 | 10.9 | 10.9 | 10.9 |
| | | | Mixture of Compounds (A3) and (A4) | — | — | — | — | — | — |
| | Polyfunctional monomer | | EO-modified bisphenol A diacrylate (n + m = 4) | 27.2 | 54.3 | 65.2 | 2.5 | 27 | — |
| | | | 1,6-hexandioldiacrylate | 32.6 | 18.5 | 18.5 | 2.5 | — | 70 |

TABLE 2-continued

|  |  |  |  |  |  |  |  |
|---|---|---|---|---|---|---|---|
|  | Monofunctional monomer | Dodecyl acrylate | 18.5 | 16.3 | 5.4 | 42.0 | 31.1 | 9.6 |
|  |  | Methoxydipropylene glycol acrylate | — | — | — | 42.1 | 31 | 9.5 |
|  | Polymerizable carboxylic acid compound | 2-(acryloyloxy)ethyl hexahydrophthalate | — | — | — | — | — | — |
|  |  | 2-(acryloyloxy)ethyl phthalate | — | — | — | — | — | — |
|  | Photoinitiator | Benzophenone | 4.3 | 4.3 | 4.3 | 4.3 | 4.3 | 4.3 |
|  |  | 1-hydroxycyclohexyl phenyl ketone | 4.3 | 4.3 | 4.3 | 4.3 | 4.3 | 4.3 |
|  | Ethylenic double bond amount [E-3 mol/g] |  | 6.6 | 5.1 | 5.0 | 6.4 | 3.9 | 8.8 |
| Physical properties | Viscosity (mPa · s) |  | 37.0 | 77.2 | 141 | 5.9 | 16.2 | 8.8 |
|  | Adhesion to metal plate |  | 100/100 | — | — | 100/100 | 100/100 | 100/100 |
|  | Etchant resistance |  | C | — | — | C | C | B |
|  | Alkali developability |  | A | — | — | A | B | C |

As seen from Tables 1 and 2, the ink compositions of the present invention exhibit low viscosities and thereby the resultant cured articles are excellent in adhesion to metal plate, etchant resistance, and alkali developability.

Example 2-1

To a homomixer was added 27.8 parts by weight of 2-(acryloyloxy)ethyl succinate, 32.6 parts by weight of 1,6-hexandioldiacrylate, 12.4 parts by weight of dodecyl acrylate, and 27.2 parts by weight of EO-modified bisphenol A diacrylate (n+m≈4). Under shaded condition, the mixture was heated to 35° C. in a dry air atmosphere and mixed for 1 hour. A photoinitiator was then added and gently mixed until it dissolves into the mixture. The mixture was press filtered through a 2 μm pore size membrane filter to obtain an ink composition. The viscosity at 25° C. of the ink composition was measured with cone/plate viscometer TVE-22L (Toki Sangyo Co., Ltd.).

The ethylenic double bond amount of the specific polyfunctional monomers contained in the composition is calculated as follows:

$$3.9E\text{-}3 \times (27.2/(27.2+32.6)) + 8.8E\text{-}3 \times (32.6/(27.2+32.6)) = 6.57E\text{-}3 \text{ (mol/g)}$$

Using an inkjet printer equipped with a piezoelectric inkjet head, the ink composition was ejected onto a 0.5 mm-thick SUS304 BA plate to print a 1 cm×5 cm image thereon.

About 0.4 seconds after printing, the metal plate was irradiated with UV light with UV irradiator (metal halide lamp M0151-L212, Eye Graphics Co., Ltd., 1 lamp: 120 W), to cure the ink composition to form a cured film. At this time, plate feed rate was set to 10 m/min, and UV irradiation was performed 4 times. The metal plate was heated at 120° C. for 15 minutes in an oven. The printed image had a uniform thickness of 8 μm. The metal plate was evaluated as in Example 1-1.

Examples 2-2 to 2-13

Ink compositions were produced as in Example 2-1 using monomers and photoinitiators listed in Table 3. Using the ink compositions thus produced, metal plates with cured films were manufactured and evaluated as in Example 2-1. The results are shown in Table 3.

TABLE 3

| Components |  | Compound ID | Ex. 2-1 | Ex. 2-2 | Ex. 2-3 | Ex. 2-4 | Ex. 2-5 | Ex. 2-6 | Ex. 2-7 |
|---|---|---|---|---|---|---|---|---|---|
| Composition (mass %) | Polymerizable succinate derivative | 2-(acryloyloxy)ethyl succinate | 27.8 | 18.4 | 14.2 | — | — | — | 8.4 |
|  |  | 2-(methacryloyloxy)ethyl succinate | — | — | — | 27.5 | 18.0 | 13.5 | — |
|  | Polyfunctional monomer | EO-modified bisphenol A diacrylate (n + m = 4) | 27.2 | 27.2 | 27.2 | 27.2 | 27.2 | 27.2 | 27.2 |
|  |  | 1,6-hexandioldiacrylate | 32.6 | 32.6 | 32.6 | 32.6 | 32.6 | 32.6 | 32.6 |
|  | Monofunctional monomer | Dodecyl acrylate | 12.4 | 21.8 | 26.0 | 12.7 | 22.2 | 26.7 | 25.7 |
|  |  | Methoxydipropylene glycolo acrylate | — | — | — | — | — | — | — |
|  | Polymerizable phosphate compound | di[2-methacryloyloxyethyl] acid phosphate | — | — | — | — | — | — | 6.1 |
|  | Polymerizable carboxylic acid compound | 2-(acryloyloxy)ethyl hexahydrophthalate | — | — | — | — | — | — | — |
|  |  | 2-(acryloyloxy)ethyl phthalate | — | — | — | — | — | — | — |
|  | Photoinitiator | Benzophenone | 4.3 | 4.3 | 4.3 | 4.3 | 4.3 | 4.3 | 4.3 |
|  |  | 1-hydroxycyclohexyl phenyl ketone | 4.3 | 4.3 | 4.3 | 4.3 | 4.3 | 4.3 | 4.3 |
|  | Ethylenic double bond amount [E-3 mol/g] |  | 6.6 | 6.6 | 6.6 | 6.6 | 6.6 | 6.6 | 6.6 |
| Physical properties | Viscosity (mPa · s) |  | 36.3 | 21.6 | 16.5 | 35.1 | 20.9 | 15.4 | 22.3 |
|  | Adhesion to metal plate |  | 80/100 | 100/100 | 100/100 | 80/100 | 100/100 | 100/100 | 100/100 |
|  | Etchant resistance |  | B | B | A | B | B | A | A |
|  | Alkali developability |  | A | A | B | A | A | B | A |

TABLE 3-continued

| | Components | Compound ID | Ex. 2-8 | Ex. 2-9 | Ex. 2-10 | Ex. 2-11 | Ex. 2-12 | Ex. 2-13 |
|---|---|---|---|---|---|---|---|---|
| Composition (mass %) | Polymerizable succinate derivative | 2-(acryloyloxy)ethyl succinate | 1.0 | — | 18.4 | 18.4 | 18.4 | 18.4 |
| | | 2-(methacryloyloxy)ethyl succinate | — | 6.2 | — | — | — | — |
| | Polyfunctional monomer | EO-modified bisphenol A diacrylate (n + m = 4) | 27.2 | 27.6 | 35.3 | 21.7 | 18.5 | 21.0 |
| | | 1,6-hexandioldiacrylate | 32.6 | 33.2 | 34 | 2.2 | 50.8 | 1.0 |
| | Monofunctional monomer | Dodecyl acrylate | 33.1 | 26.9 | 12.3 | 28.9 | 12.3 | 29.8 |
| | | Methoxydipropylene glycolo acrylate | — | — | — | 28.8 | — | 29.8 |
| | Polymerizable phosphate compound | di[2-methacryloyloxyethyl] acid phosphate | 6.1 | 6.1 | — | — | — | — |
| | Polymerizable carboxylic acid compound | 2-(acryloyloxy)ethyl hexahydrophthalate | — | — | — | — | — | — |
| | | 2-(acryloyloxy)ethyl phthalate | — | — | — | — | — | — |
| | Photoinitiator | Benzophenone | 4.3 | 4.3 | 4.3 | 4.3 | 4.3 | 4.3 |
| | | 1-hydroxycyclohexyl phenyl ketone | 4.3 | 4.3 | 4.3 | 4.3 | 4.3 | 4.3 |
| | Ethylenic double bond amount [E-3 mol/g] | | 6.6 | 6.6 | 6.3 | 4.4 | 7.6 | 4.1 |
| Physical properties | Viscosity (mPa · s) | | 17.9 | 20.3 | 42.3 | 14.9 | 16.1 | 13.9 |
| | Adhesion to metal plate | | 100/100 | 100/100 | 100/100 | 100/100 | 100/100 | 100/100 |
| | Etchant resistance | | A | A | A | B | B | B |
| | Alkali developability | | B | A | A | A | A | A |

Comparative Examples 2-1 to 2-13

Ink compositions were produced as in Example 2-1 using monomers and photoinitiators listed in Table 4. Using the ink compositions thus produced, metal plates with cured films were manufactured and evaluated as in Example 2-1. The results are shown in Table 4. In Comparative Examples 2-7 to 2-10, formation of cured films failed because viscosity was too high to enable inkjet printing; thus, evaluations of physical property could not be conducted. This is indicated by "-" in Table 4.

TABLE 4

| | Components | Compound ID | Comp. Ex. 2-1 | Comp. Ex. 2-2 | Comp. Ex. 2-3 | Comp. Ex. 2-4 | Comp. Ex. 2-5 | Comp. Ex. 2-6 | Comp. Ex. 2-7 |
|---|---|---|---|---|---|---|---|---|---|
| Composition (mass %) | Polymerizable succinate derivative | 2-(acryloyloxy)ethyl succinate | — | — | — | — | — | — | 38.1 |
| | | 2-(methacryloyloxy)ethyl succinate | — | — | — | — | — | — | — |
| | Polyfunctional monomer | EO-modified bisphenol A diacrylate (n + m = 4) | 27.2 | 27.2 | 27.2 | 27.2 | 27.2 | 27.2 | 27.2 |
| | | 1,6-hexandioldiacrylate | 32.6 | 32.6 | 32.6 | 32.6 | 32.6 | 32.6 | 32.6 |
| | Monofunctional monomer | Dodecyl acrylate | 34.8 | 29.3 | 18.5 | 34.8 | 29.3 | 18.5 | 2.1 |
| | | Methoxydipropylene glycolo acrylate | — | — | — | — | — | — | — |
| | Polymerizable phosphate compound | di[2-methacryloyloxyethyl] acid phosphate | — | — | — | — | — | — | — |
| | Polymerizable carboxylic acid compound | 2-(acryloyloxy)ethyl hexahydrophthalate | 5.4 | 10.9 | 21.7 | — | — | — | — |
| | | 2-(acryloyloxy)ethyl phthalate | — | — | — | 5.4 | 10.9 | 21.7 | — |
| | Photoinitiator | Benzophenone | 4.3 | 4.3 | 4.3 | 4.3 | 4.3 | 4.3 | 4.3 |
| | | 1-hydroxycyclohexyl phenyl ketone | 4.3 | 4.3 | 4.3 | 4.3 | 4.3 | 4.3 | 4.3 |
| | Ethylenic double bond amount [E-3 mol/g] | | 6.6 | 6.6 | 6.6 | 6.6 | 6.6 | 6.6 | 6.6 |
| Physical properties | Viscosity (mPa · s) | | 16.5 | 20.6 | 37.6 | 17.0 | 21.3 | 42.5 | 60.2 |
| | Adhesion to metal plate | | 5/100 | 10/100 | 60/100 | 5/100 | 10/100 | 60/100 | — |
| | Etchant resistance | | A | B | C | A | B | C | — |
| | Alkali developability | | B | B | A | B | B | A | — |

| | Components | Compound ID | Comp. Ex. 2-8 | Comp. Ex. 2-9 | Comp. Ex. 2-10 | Comp. Ex. 2-11 | Comp. Ex. 2-12 | Comp. Ex. 2-13 |
|---|---|---|---|---|---|---|---|---|
| Composition (mass %) | Polymerizable succinate derivative | 2-(acryloyloxy)ethyl succinate | — | 18.4 | 18.4 | 18.4 | 18.4 | 18.4 |
| | | 2-(methacryloyloxy)ethyl succinate | 33.5 | — | — | — | — | — |

TABLE 4-continued

| | | | | | | | |
|---|---|---|---|---|---|---|---|
| Polyfunctional monomer | EO-modified bisphenol A diacrylate (n + m = 4) | 27.2 | 54.3 | 60.7 | 2.5 | 27.0 | — |
| | 1,6-hexandioldiacrylate | 32.6 | 18.5 | 15.5 | 2.5 | — | 70 |
| Monofunctional monomer | Dodecyl acrylate | 6.7 | 8.8 | 5.4 | 38.3 | 27.3 | 5.8 |
| | Methoxydipropylene glycolo acrylate | — | — | — | 38.3 | 27.3 | 5.8 |
| Polymerizable phosphate compound | di[2-methacryloyloxyethyl] acid phosphate | — | — | — | — | — | — |
| Polymerizable carboxylic acid compound | 2-(acryloyloxy)ethyl hexahydrophthalate | — | — | — | — | — | — |
| | 2-(acryloyloxy)ethyl phthalate | — | — | — | — | — | — |
| Photoinitiator | Benzophenone | 4.3 | 4.3 | 4.3 | 4.3 | 4.3 | 4.3 |
| | 1-hydroxycyclohexyl phenyl ketone | 4.3 | 4.3 | 4.3 | 4.3 | 4.3 | 4.3 |
| Ethylenic double bond amount [E-3 mol/g] | | 6.6 | 5.1 | 4.9 | 6.4 | 3.9 | 8.8 |
| Physical properties | Viscosity (mPa · s) | 51.8 | 75.3 | 139.1 | 6.4 | 17.5 | 9.3 |
| | Adhesion to metal plate | — | — | — | 100/100 | 100/100 | 100/100 |
| | Etchant resistance | — | — | — | C | C | B |
| | Alkali developability | — | — | — | A | B | C |

As seen from Tables 3 and 4, the ink compositions of the present invention exhibit low viscosities and the resultant cured articles are excellent in adhesion to metal plate, etchant resistance, and alkali developability.

Industrial Applicability

Ink compositions of the present invention provide cured articles with excellent adhesion to metal plate, etchant resistance and alkali developability, and exhibit suitable viscosity that enables stable inkjet ejection. Thus, the ink compositions are useful as inkjet ink compositions.

The present application claims the priority of Japanese Patent Application No. 2008-084470 filed on Mar. 27, 2008 and Japanese Patent Application No. 2008-216909 filed on Aug. 26, 2008, the entire contents of which are herein incorporated by reference.

The invention claimed is:

1. An inkjet ink composition for etching resist comprising polymerizable monomers which can be polymerized by irradiation with an active energy ray, wherein
the composition has a viscosity at 25° C. of 3-50 mPa·s, and the polymerizable monomers include, based on total monomers:
1-30 mass % of polymerizable ester compound having the following general formula (I);
3-10 mass % of polymerizable phosphate compound having a phosphoester group and an ethylenic double bond in the molecule thereof;
10-75 mass % of polyfunctional monomer which has two or more ethylenic double bonds and has no phosphoester group in the molecule thereof, the ethylenic double bond amount being $4 \times 10^{-3}$ to $8 \times 10^{-3}$ mol/g; and
10-75 mass % of monofunctional monomer which has one ethylenic double bond and has neither phosphoester group nor carboxylic group in the molecule thereof:

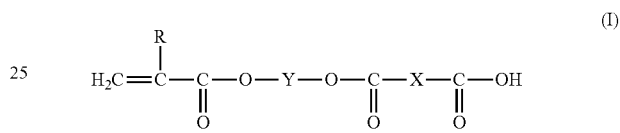

where X represents $C_{1-3}$ alkylene, Y represents $C_{2-3}$ alkylene, and R represents hydrogen or methyl.

2. The composition according to claim 1, wherein the polymerizable ester compound is a compound having general formula (I) where X is ethylene.

3. The composition according to claim 1, wherein the polyfunctional monomer has the following general formula (B1) or (B2):

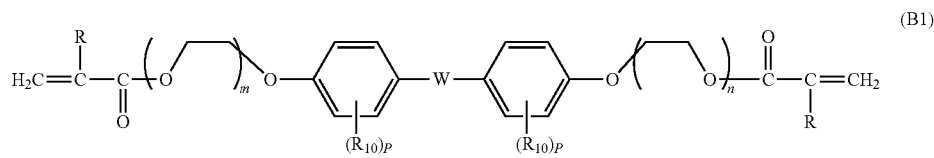

where R independently represents hydrogen or methyl, $R_{10}$ independently represents $C_{1-5}$ alkyl, P represents an integer of 0-4, W represents a single bond, methylene or isopropylidene, and n and m each represent an integer of 0-6,

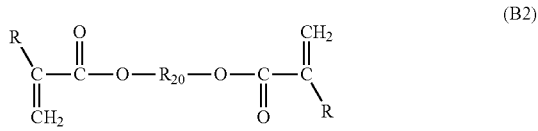

where R independently represents hydrogen or methyl, and $R_{20}$ represents $C_{3-9}$ alkylene.

4. The composition according to claim 1, wherein the polymerizable phosphate compound has any one of the following general formulas (A1) to (A4):

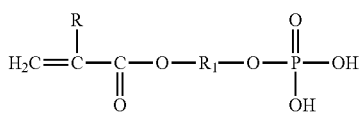

(A1)

where R represents hydrogen or methyl, and $R_1$ represents $C_{1-4}$ alkylene,

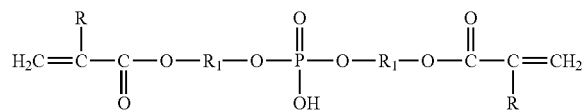

(A2)

where R independently represents hydrogen or methyl, and $R_1$ independently represents $C_{1-4}$ alkylene,

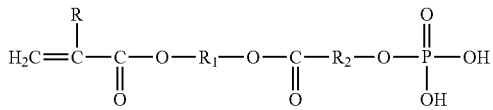

(A3)

where R represents hydrogen or methyl, $R_1$ represents $C_{1-4}$ alkylene, and $R_2$ represents $C_{1-10}$ alkylene,

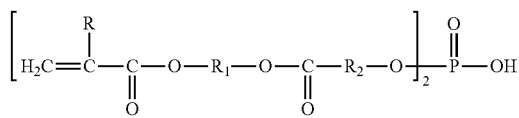

(A4)

where R represents hydrogen or methyl, $R_1$ represents $C_{1-4}$ alkylene, and $R_2$ represents $C_{1-10}$ alkylene.

5. A method of manufacturing an etched metal plate comprising:

ejecting the ink composition according to claim 1 onto a metal plate;

curing the ink composition by irradiation with an active energy ray;

etching a surface of the metal plate obtained from the preceding process; and removing the cured ink composition by treating the etched metal plate with alkali solution.

* * * * *